United States Patent [19]
Yamada

[11] Patent Number: 5,404,012
[45] Date of Patent: Apr. 4, 1995

[54] SCANNING ELECTRON MICROSCOPE

[75] Inventor: Atsushi Yamada, Tokyo, Japan

[73] Assignee: JEOL Ltd., Tokyo, Japan

[21] Appl. No.: 196,574

[22] Filed: Feb. 15, 1994

[30] Foreign Application Priority Data

Feb. 15, 1993 [JP] Japan .................. 5-025149

[51] Int. Cl.$^6$ .......................... H01J 37/28; H01J 37/21
[52] U.S. Cl. ................................ 250/310; 250/396 R; 250/396 ML
[58] Field of Search ............ 250/310, 396 ML, 396 R

[56] References Cited

U.S. PATENT DOCUMENTS

| | | | |
|---|---|---|---|
| 4,199,681 | 4/1980 | Namae | 250/310 |
| 4,978,856 | 12/1990 | Akado | 250/310 |
| 5,130,540 | 7/1992 | Yamada et al. | 250/310 |
| 5,198,668 | 3/1993 | Yamada | 250/310 |

*Primary Examiner*—Jack I. Berman
*Attorney, Agent, or Firm*—Webb Ziesenheim Bruening Logsdon Orkin & Hanson

[57] ABSTRACT

A scanning electron microscope capable of producing a stable image even if an automated focusing operation is being performed. The microscope has a secondary electron detector, a vertical scanning signal generator, and an image memory connected with a CRT. The output signal from the detector is supplied to the image memory via an amplifier and an A/D converter and also to an integrator via a filter circuit and an absolute value circuit. The specimen is scanned to produce an image and is substantially simultaneously scanned to gather data for adjusting the focus by stepwise adjusting the objective lens current. The stepwise adjustment of the objective lens takes place only during scanning to gather data.

6 Claims, 4 Drawing Sheets

SCANNING ELECTRON MICROSCOPE

FIELD OF THE INVENTION

The present invention relates to a scanning electron microscope capable of automated focusing.

BACKGROUND OF THE INVENTION

FIG. 1 shows a conventional scanning electron microscope capable of automated focusing. This microscope has an electron gun (not shown) producing an electron beam 1 which is accelerated. The microscope is further equipped with two stages of deflection coils 2 and 3 each of which contains horizontal and vertical deflection coils. The beam is sharply focused by an objective lens 4 and made to hit a specimen 5. The resulting electrons such as secondary electrons are detected by a detector 6.

A horizontal scanning signal-generating circuit 7 supplies horizontal scanning signals to the horizontal deflection coils of the two stages of deflection coils 2 and 3 via a driver circuit 8. A vertical scanning signal generating circuit 9 supplies vertical scanning signals to the vertical deflection coils of the two stages of deflection coils via a driver circuit 10. The frequencies of these scanning signals are controlled by a control circuit 11 consisting of a computer.

The output signal from the detector 6 is fed via an amplifier 12 to a CRT 13 and a filter circuit 14, the CRT 13 being supplied with the horizontal and vertical scanning signals. The output signal from the filter circuit 14 is furnished via an absolute value circuit 15 to an integrator circuit 16, which integrates its input value. The output value from the integrator circuit 16 is converted into digital form by an A/D converter 17. The output signal from the A/D converter 17 is stored in a signal intensity distribution memory 19 included in the control circuit 11.

The control circuit 11 further includes a maximum value detector unit 20 for detecting the maximum value of numerous integrated values stored in the signal intensity distribution memory 19. The control circuit 11 is further equipped with an objective lens value setting data memory 21 and an auxiliary coil value setting data memory 22. The value of the objective lens value setting data memory 21 is supplied to an objective lens driver circuit 24 via a D/A converter 23. The value of the auxiliary coil value setting data memory 22 is supplied via a D/A converter 25 to a driver circuit 27 which acts to drive an auxiliary coil 26. The microscope further includes an objective lens value conversion unit 28 and an autofocus unit 29.

The electron microscope constructed as described above operates in the manner described now. When a secondary electron image is observed, the horizontal scanning signal-generating circuit 7 and the vertical scanning signal-generating circuit 9 which are under the control of the control circuit 11 supply scanning signals to the deflection coils 2 and 3, the scanning signal giving a desired scanning speed. The electron beam 1 is deflected by the deflection coils 2 and 3 and scans a desired region on the specimen 5. The irradiation of the electron beam upon the specimen 5 generates secondary electrons, which are detected by the detector 6. The output signal from the detector 6 is amplified by the amplifier 12 and fed to the CRT 13 that is supplied with the scanning signal from horizontal and vertical scanning signal generators 7 and 9, respectively. As a result, a secondary electron image of the specimen is displayed on the CRT 13.

An automated focusing operation is described now by referring to the operating characteristic curve of the auxiliary coil 26 shown in FIG. 2(a) and to the operating characteristic curve of the objective lens 4 shown in FIG. 2(b). In these two graphs, the intensity of excitation which corresponds to the distance between the specimen surface and the lens is plotted on the vertical axis. Time is plotted on the horizontal axis. First, an initial value $\Delta Z$ shown in FIG. 2(b) is set into the objective lens value setting data memory 21. The objective lens driver circuit 24 is operated according to this initial value and excites the objective lens 4. Then, the autofocus unit 29 begins to operate and the value of the auxiliary coil value setting data memory 22 is varied linearly as shown in FIG. 2(a). More precisely, the set value is varied in a stepwise fashion as shown in FIG. 3(a).

Whenever the set value is varied in an increment in this way, a scanning signal is supplied to the deflection coils 2 and 3 so that the desired region on the specimen 5 may be scanned once. The resulting secondary electrons are detected by the detector 6. The output signal from the detector 6 is amplified by the amplifier 12. Components of the output signal from the amplifier 2 which are in a certain range are filtered out by the filter circuit 14. Every negative signal component is inverted by the absolute value circuit 15.

The output from the absolute value circuit 15 is supplied to the integrator circuit 16, which integrates its input signal. This integration operation is carried out during one two-dimensional scan of the desired region on the specimen. After the end of this scanning operation, the integrated value is stored in the signal intensity distribution memory 19 included in the control circuit 11 via the A/D converter 17. This integration operation is effected whenever the excitation of the auxiliary coil 26 is varied in an increment. When the excitation from $+A$ to $-A$ is completed, the distribution shown in FIG. 3(b) is stored in the memory 19.

The maximum value-detecting unit 20 in the control circuit 11 detects the maximum value of the distribution shown in FIG. 3(b). The corresponding intensity of excitation of the auxiliary coil 26 is supplied to the objective lens value conversion unit 28. When the excitation is maximal in this manner, the electron beam is in focus. As a result, the value of the objective lens value setting data memory 21 is the initially set value $\Delta Z$ plus the intensity of excitation $\Delta Z1$ (i.e., the deviation of the value at the focal point from the initial value $\Delta Z$) of the auxiliary coil when the beam is in focus. After the excitation of the objective lens 4 is set to this value $\Delta Z + \Delta Z1$, the aforementioned automated focusing operation is conducted again. At this time, the amount of deviation $\Delta Z2$ of $\Delta Z + \Delta Z1$ from the value at the focal point is stored in the auxiliary coil value setting data memory 22. The excitation value $\Delta Z1$ of the objective lens and the excitation value $\Delta Z2$ of the auxiliary coil are shown in FIGS. 2(a) and 2(b). When these excitation values $\Delta Z1$ and $\Delta Z2$ are stored in the data memory, the automated focusing operation is ended.

In the method described above, an automated focusing operation is automatically started by setting the autofocus unit 29 into operation. Therefore, when the stage carrying a specimen is moved or in other similar situations, the beam comes out of focus. This makes it impossible to observe an image which is kept in focus.

Also, when the automated focusing operation is started, the excitation of the auxiliary coil 26 varies from moment to moment, thus changing the state of the image. Hence, the image cannot be observed well.

It is an object of the present invention to provide a scanning electron microscope for creating an image that is kept in focus and stable even if an automated focusing operation is being performed.

SUMMARY OF THE INVENTION

A scanning electron microscope according to the present invention comprises an electron optical system including an objective lens and horizontal and vertical deflection coils. A scanning signal generator is arranged to cooperate with the deflection coils for repeatedly making a first scan across a specimen with an electron beam to obtain an electron optical image and for repeatedly making a second scan of the electron beam to bring the image into focus. A detector detects electrons produced as a result of the first and the second scans across the specimen.

The signal produced by the detector is stored in a storage as by digitizing the signal and storing in a computer memory. An objective lens driver or power supply sweeps the exciting current for varying the focal distance of the objective lens in an increment whenever the scanning means makes the second scan. A control circuit evaluates the signal from the detector when an exciting current supplied to the objective lens is varied to each different value determined by the objective lens exciting current sweeping means. The control circuit includes a setting means for setting the exciting current to a value at which the image is brought into focus, according to results of evaluation made by the control circuit. A display means for repeatedly reading out contents of the storage sends the contents to a display unit to visualize the electron optical image.

Another scanning electron microscope according to the invention comprises an electron optical system including an objective lens and horizontal and vertical deflections coils. A scanning signal generator is arranged to cooperate with the deflection coils for repeatedly scanning both a first region to obtain an electron optical image and an adjacent region used for focusing with an electron beam in two dimensions during identical vertical scanning periods. A detector detects electrons produced by scans made across the first region and the adjacent region.

The signal produced by the detector is stored in a storage as by digitizing the signal and storing in a computer memory. An objective lens exciting current sweeping means varies the focal distance of the objective lens in an increment whenever the scanning means scans the first region. A control circuit evaluates the signal from the detector when an exciting current supplied to the objective lens is varied to each different value determined by the objective lens exciting current sweeping means and sets the exciting current to a value at which the image is brought into focus, according to results of evaluation made by the evaluating means. A display means for repeatedly reading out contents of the storage sends the contents to a display unit to visualize the image.

In the novel scanning electron microscope, a signal obtained from a part or all of a region on a specimen scanned by the electron beam is stored and a scanning image of the specimen is obtained. An automated focusing operation is always performed in the other portion or in the whole scanned region. Consequently, observation of the image is not affected by the automated focusing operation.

DETAILED DESCRIPTION OF THE INVENTION

Figure 1:
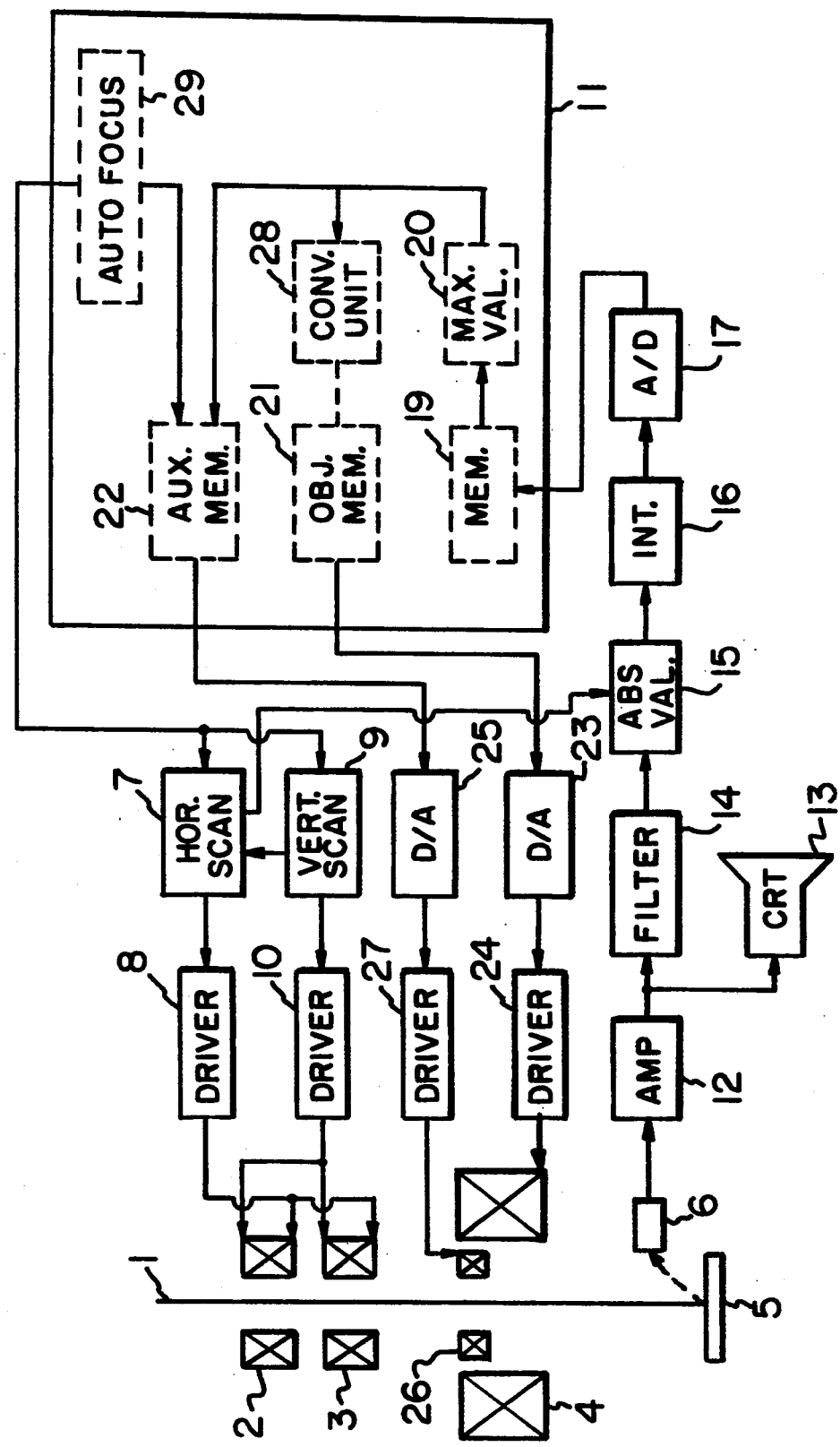
FIG. 1 is a block diagram of a conventional scanning electron microscope capable of automated focusing.
Figure 2A:
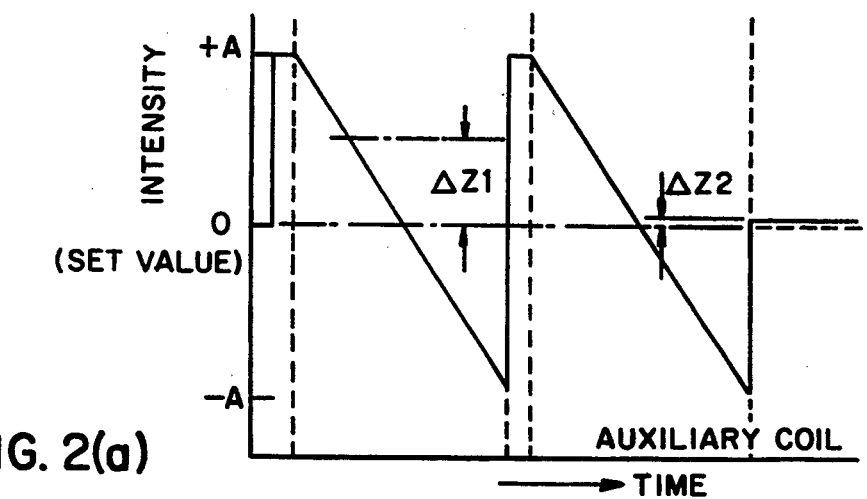
FIGS. 2(a) and 2(b) are waveform diagrams illustrating the automated focusing operation of the conventional scanning electron microscope shown in FIG. 1.
Figure 2B:
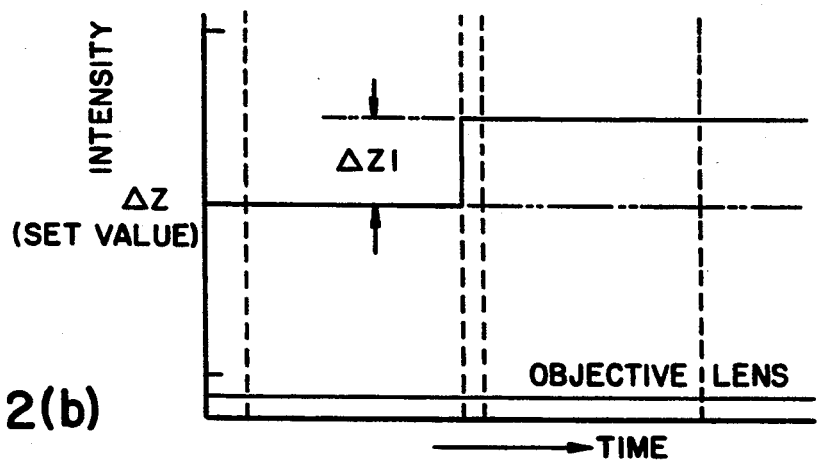
Figure 4:
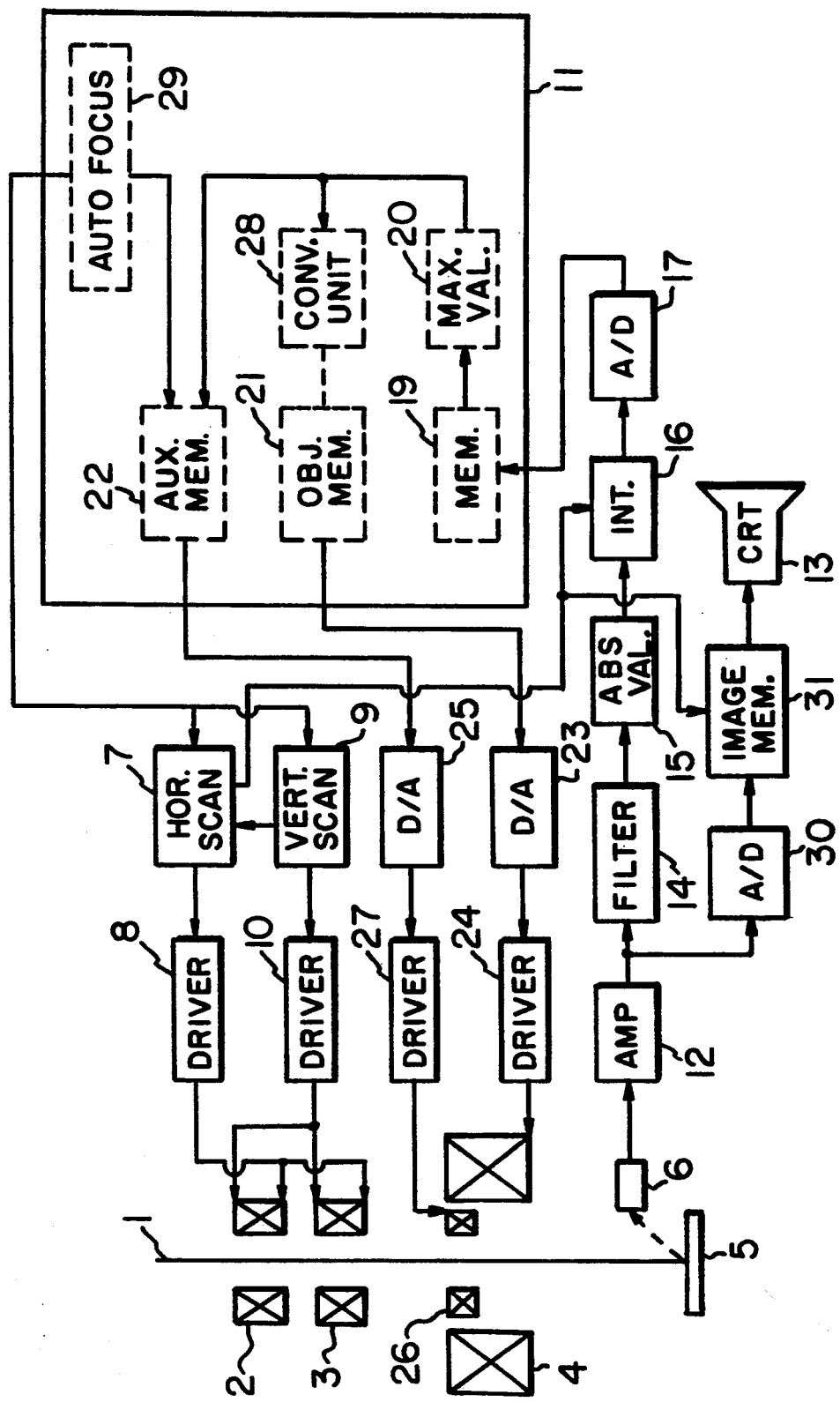
FIG. 4 is a block diagram of a scanning electron microscope according to the present invention.

Referring to FIG. 4, there is shown a scanning electron microscope according to the invention. It is to be noted that like components are indicated by like reference numerals in various figures and that those components which have been already described in conjunction with FIG. 1 will not be described in detail below. The system shown in FIG. 4 is similar to the system shown in FIG. 1 except that the output signal from the detector 6 is amplified by the amplifier 12, converted into digital form by an A/D converter 30, and supplied to an image memory 31, and that the electron beam is scanned vertically beyond the observed region according to the signal from the vertical scanning signal-generating circuit 9. The image memory 31 stores only the signal produced during a first certain vertical scanning period according to the signal from the vertical scanning signal-generating circuit 9. The integrator circuit 16 integrates only the signal produced during a second certain vertical scanning period according to the signal from the vertical scanning signal-generating circuit 9. The operation of this structure is described in further detail below.

Figure 5:
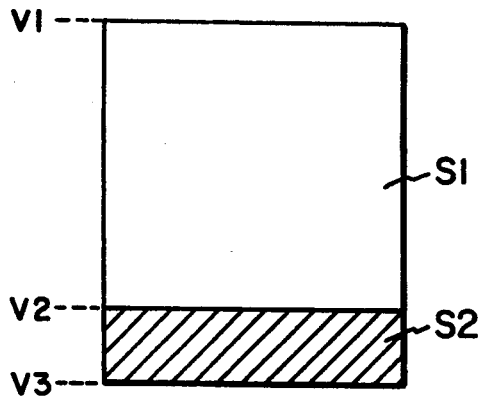
FIG. 5 is a diagram illustrating a region on a specimen scanned by the electron beam of the microscope shown in FIGS. 3(a) and 3(b)

A scanning signal is supplied from the scanning signal-generating circuits 7 and 9 to the deflection coils 2 and 3. The electron beam 1 is scanned across a desired region on the specimen 5. FIG. 5 shows the range of this scan. In FIG. 5, a region S1 is an observed region on the specimen. An automated focusing operation is performed in a hatched region S2. In particular, during a vertical scanning period from V1 to V2, the image memory 31 stores the output signal from the secondary electron detector 6. A secondary electron image emanating from the scanned region S1 on the specimen 3 is displayed on the CRT 13 according to the data stored in the image memory 31.

Figure 3A:
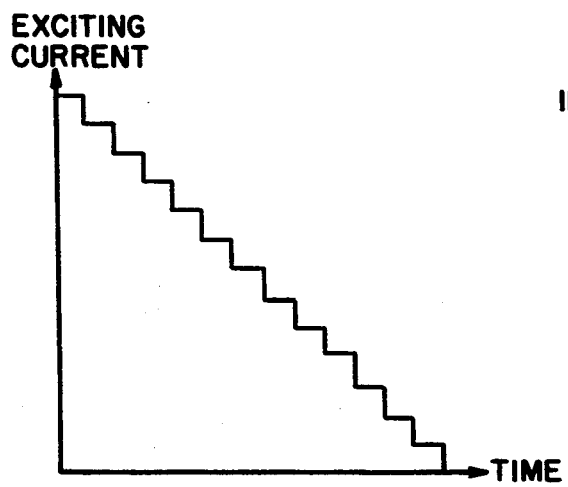
FIGS. 3(a) and 3(b) are diagrams illustrating the automated focusing operation of the conventional scanning electron microscope shown in FIG. 1.
Figure 3B:
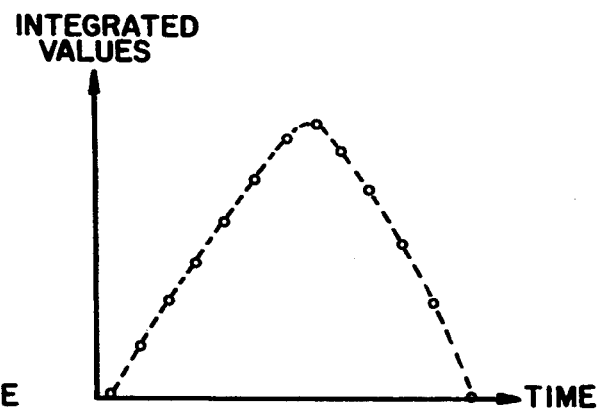

During a vertical scanning period from V2 to V3, the integrator circuit 16 integrates the output signal from the secondary electron detector 6 which is supplied via the filter circuit 14 and the absolute value circuit 15. During this vertical scanning period from V2 to V3, an exciting current varying in a stepwise fashion is supplied to the auxiliary coil 26 in synchronism with the vertical scan according to the values of the data memory 22. More specifically, during the vertical scanning period from V1 to V2, the exciting current to the auxiliary coil 26 is maintained at 0 or other constant value. During the vertical scanning period from V2 to V3, the exciting current to the auxiliary coil 26 is varied in a stepwise fashion. When a required number of scans of the regions S1 and S2 are completed, the signal intensity distribution (FIG. 3(b)) obtained by the scans of the region S2 is stored in the signal intensity distribution memory 19. The objective lens value conversion unit 28 places the focus deviation amount $\Delta Z1$ into the objective lens value setting data memory 21 according to the signal intensity distribution stored in the memory 19. This operation is performed in the same manner as the operation of the prior art instrument shown in FIG. 1. Then, an automated focusing operation is carried out to place a deviation amount $\Delta Z2$ into the auxiliary coil data memory 22. Therefore, the specimen image from the region S1 is in focus. Deviation amounts $\Delta Zn$ detected subsequently are stored in the auxiliary coil data memory 22. However, after movement of the stage or when the amount of correction exceeds the tolerable range for the auxiliary coil, the process is repeated from the operation for placing the deviation amount $\Delta Z1$ into the objective lens.

The focusing operation described above is carried out continuously and automatically. In the scanned region S1, the electron beam can be scanned while substantially kept in focus. An image of constantly good quality can be displayed on the CRT 13. Especially, when the specimen 5 is moved, focused images can be observed successively. During the execution of the automated focusing operation, the excitation of the auxiliary coil 26 does not change in the region S1. In consequence, the image presented on the CRT 13 does not change.

Figure 6:
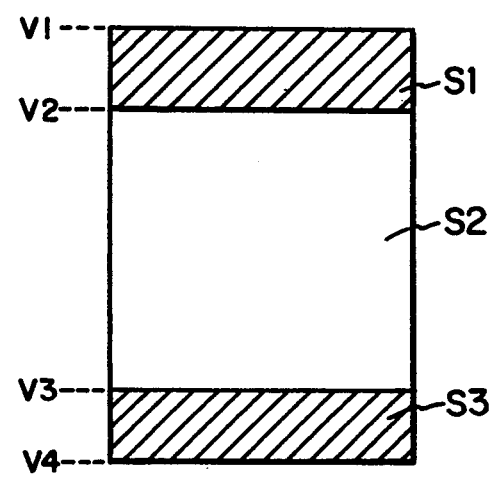
FIG. 6 is a diagram illustrating regions on a specimen scanned by the electron beam of the microscope shown in FIGS. 3(a) and 3(b)

FIG. 6 illustrates another scanning method. An automated focusing operation is carried out during vertical scanning periods V1-V2 and V3-V4, i.e., in hatched regions S1 and S3. Region S2 is observed during the vertical scanning period V2-V3.

Figure 7:
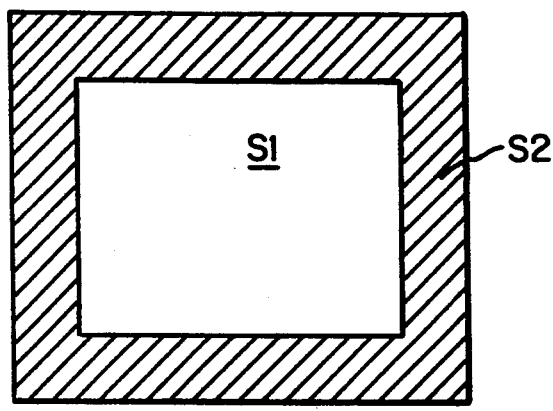
FIG. 7 is a diagram illustrating a region on a specimen scanned by the electron beam of the microscope shown in FIGS. 3(a) and 3(b).

FIG. 7 illustrates a further scanning method. In this example, a central region S1 in a region scanned by an electron beam is observed. The automated focusing operation is effected in the peripheral region S2.

Whenever the focus deviation amount is established, i.e., placed into the objective lens value setting data memory 21, the observed region may be scanned with the electron beam, and a new specimen image may be displayed on the CRT 13.

It is also possible that the observed region is not separated from the region in which the automated focusing operation is carried out. One scanned region S1 may act as these two regions. For example, a specimen image is obtained by the first scan of the electron beam across the region S1. An automated focusing operation is effected in synchronism with the second scan of the electron beam across the region S1. Another specimen image is obtained from the third scan across the region S1. An automated focusing operation is conducted in synchronism with the fourth scan across the region S1. In this way, collection of a specimen image and an automated focusing operation are alternately carried out. The amount of deviation may be established by the operation described above.

In the embodiments described above, secondary electrons are detected. Reflected electrons may also be detected.

In the novel scanning electron microscope, the signal obtained from a part or all of a region on a specimen scanned by the electron beam is stored, a scanning image of the specimen is obtained, and an automated focusing operation is constantly performed in the other region or over the whole scanned region. Consequently, the observed image is kept in focus. Also, the observed image is stable throughout the period of the automated focusing operation.

Having thus described my invention with the detail and particularity required by the Patent Laws, what is claimed and desired to be protected by Letters Patent is set forth in the following claims.

What is claimed is:

1. A scanning electron microscope in which an electron beam is focused by an objective lens including means for automatically adjusting the focus of the electron beam, comprising:
   a scanning means for repeatedly making a first scan across a specimen with an electron beam to obtain an electron optical image and for repeatedly making a second scan of said electron beam to bring said image into focus;
   a detector for detecting electrons produced as a result of the first and the second scans across said specimen;
   a storage means for storing a signal produced from said detector;
   means for sweeping the objective lens exciting current thus varying a focal distance of said objective lens in an increment whenever said scanning means makes the second scan;
   an evaluating means for evaluating said signal from said detector when an exciting current supplied to said objective lens is varied to each different value determined by said objective lens exciting current sweeping means;
   a setting means for setting said exciting current of the objective lens to a value at which said image is brought into focus, according to results of evaluation made by said evaluating means; and
   a display means for repeatedly reading out contents of said storage means, sending the contents to a display unit, and visualizing said electron optical image.

2. The scanning electron microscope of claim 1, wherein scanning signals supplied to said scanning means are so selected that said first scan and said second scan are made over different regions on the specimen.

3. The scanning electron microscope of claim 1, wherein scanning signals supplied to said scanning means are so selected that said first scan and said second scan are made over adjacent regions over the specimen.

4. The scanning electron microscope of claim 1, wherein scanning signals supplied to said scanning means are so selected that the said first scan and said second scan are made over identical regions of the specimen.

5. The scanning electron microscope of claim 1, wherein said objective lens consists of a main coil and an auxiliary coil, and wherein an exciting current varying in a stepwise fashion is supplied into said auxiliary coil, thus sweeping said exciting current.

6. A scanning electron microscope in which an electron beam is focused by an objective lens including means for automatically adjusting the focus of the electron beam, comprising:
- a scanning means for repeatedly scanning both a first region of the specimen to obtain an electron optical image and an adjacent region of the specimen used for focusing with an electron beam in two dimensions during identical vertical scanning periods;
- a detector for detecting electrons produced by scans made across said first region and said adjacent region;
- a storage means for storing a signal produced from said detector;
- means for sweeping the objective lens exciting current thus varying a focal distance of said objective lens in an increment whenever said scanning means scans said adjacent region;
- an evaluating means for evaluating said signal from said detector when an exciting current supplied to said objective lens is varied to each different value determined by said objective lens exciting current sweeping means;
- a setting means for setting said exciting current of the objective lens to a value at which said image is brought into focus, according to results of evaluation made by said evaluating means; and
- a display means for repeatedly reading out contents of said storage means, sending the contents to a display unit, and visualizing said electron optical image.

* * * * *